United States Patent [19]

Nonaka

[11] Patent Number: 4,525,639
[45] Date of Patent: Jun. 25, 1985

[54] DYNAMIC MOS CIRCUIT BLOCK AND STATIC BIPOLAR TRANSISTOR CIRCUIT BLOCK INTEGRATED CIRCUIT DEVICE

[75] Inventor: Terumoto Nonaka, Hamakita, Japan

[73] Assignee: Nippon Gakki Seizo Kabushiki Kaisha, Hamamatsu, Japan

[21] Appl. No.: 374,893

[22] Filed: May 4, 1982

[30] Foreign Application Priority Data

May 9, 1981 [JP] Japan .................. 56-69784

[51] Int. Cl.³ .............. H03K 19/092; H03K 19/096; G11C 19/28
[52] U.S. Cl. .................. 307/446; 307/269; 307/480; 377/78; 377/79
[58] Field of Search .......... 307/443, 446, 475, 480, 307/459, 477, 269; 377/64, 81, 77–79; 365/177; 357/22 E

[56] References Cited

U.S. PATENT DOCUMENTS

| | | | |
|---|---|---|---|
| 3,745,539 | 7/1973 | Davidson et al. | 365/177 X |
| 3,993,916 | 11/1976 | Copeland et al. | 377/79 |
| 4,034,301 | 7/1977 | Kashio | 377/79 X |
| 4,150,392 | 4/1979 | Nonaka | 307/477 X |
| 4,398,833 | 8/1983 | Tanaka | 307/477 X |

OTHER PUBLICATIONS

Nishizawa, "Bipolar Mode Static Induction Transistor", Proceedings 11th Conf. ISSD, Tokyo, Japan, 1979, J.J.A.P., vol. 19, (1980), pp. 289–293.

Primary Examiner—Stanley D. Miller
Assistant Examiner—D. R. Hudspeth
Attorney, Agent, or Firm—Cushman, Darby & Cushman

[57] ABSTRACT

A digital semiconductor integrated circuit device comprising a common semiconductor substrate, a dynamic MOS circuit block composed mainly of a MOS-FET, and a static bipolar circuit block composed of a bipolar transistor or an SIT which is operated in a "bipolar mode" and cascade-connected to said dynamic MOS circuit block in said common semiconductor substrate, and arranged to be operative so that, by setting the timing of clock pulses, the logical operations of these circuit blocks are performed in a timed relationship with each other. Thus, this integrated circuit device can be produced with minimized dependency of its operation velocity upon the design of these circuit blocks and can perform a high-speed operation and can provide a high packing density.

16 Claims, 5 Drawing Figures

DYNAMIC MOS CIRCUIT BLOCK AND STATIC BIPOLAR TRANSISTOR CIRCUIT BLOCK INTEGRATED CIRCUIT DEVICE

BACKGROUND OF THE INVENTION (a) Field of the Invention

The present invention relates to a semiconductor integrated circuit, and more particularly it pertains to a digital semiconductor integrated circuit device which is of the type that a dynamic MOS circuit block which is comprised of a combination of such transistors as MOS transistors, and a static bipolar circuit block which is comprised of a combination of such transistors as bipolar transistors, are arranged in a common semiconductor substrate. Hereinafter, the term "integrated circuit" will be used in its abbreviated form "IC" throughout this specification.

(b) Description of the Prior Art

The semiconductor integrated circuits which have been called by such well-known abbreviated terms as IC, LSI and VLSI are divided roughly into the two large groups, analog IC and digital IC.

The former are employed in electronic apparatuses for household use or for tele-communication, which deal with analog electric signals wherein the waveshape per se of an input electric signal such as an audio signal provides for significant information. The latter, on the other hand, are employed in such electronic apparatuses that deal with digital electric signals as are used typically in electronic computers.

The digital IC may also be roughly divided further into logic IC and memory IC when viewed from the point of their operating functions, although there are many cases in which a memory IC having a memorizing function is included in the sphere of a logic IC.

There exists an IC having a single function such that it has either the "memory" function or the logic function. Many of the ICs are such that there are incorporated, in a single semiconductor chip or slice, a number of peripheral circuits having other functions such as pulse generation, power supply and buffering, in addition to said memory or logic functions.

In any one of the digital ICs such as a memory IC and a logic IC, it is well known that the principal constituting elements which form the circuit blocks having those functions as mentioned above are transistors. At present, transistors are roughly divided into bipolar transistors and unipolar transistor (i.e. MOS-FET). Therefore, devices are called either MOS IC or bipolar IC, depending on the difference in the type of the transistors employed. For example, a typical digital IC using a bipolar transistor includes TTL (Transistor-Transistor-Logic) and IIL (Integrated-Injection-Logic).

It is added here that a transistor called a "Static Induction Transistor" has been recently developed, and its superiority in characteristics when it is incorporated in an IC has been found to be prominently useful. Thus, various semiconductor devices will have to be re-classified soon. However, description in this specification will be made by following the manner of grouping of transistors which has been accepted in the past. Regarding this new type of transistor, i.e. SIT, reference will be made later in this specification.

Now, when the abilities or functions of a digital IC is studied, attention is paid to such points as the speed of logic operation, or the operating velocity of, for example, access time or cycle time, for memory as well as power dissipation, packing density, easiness in laying out various circuit blocks in a semiconductor substrate, easiness of fabrication, and price.

Although, owing to the recent remarkable technical progress in the field of semiconductor devices, the functions and abilities of MOS ICs have approached quite close to those of bipolar ICs, making it difficult to discriminate which is superior to the other, there still is the difference in functions and abilities attributable to the difference in the operation principles of MOS transistors and bipolar transistors. Such difference may be briefly described as follows.

A bipolar IC, as compared with a MOS IC, is quicker in the velocity of performing memory operation, and this velocity would not change so prominently even by a change in the manner of layout of, for example, the constituent transistors employed. In other words, a bipolar IC is such that its operation velocity has little dependency on layout. Also, a bipolar IC is such that its circuit arrangement is made in the usual manner, i.e. in static type, which basically uses six (6) transistors as a circuit arrangement to form an one bit memory. In contrast thereto, a MOS IC not only is able to form the abovesaid static type circuit arrangement, but also allows one to form a dynamic type circuit arrangement which utilizes the lengthy period of time required for the electric charge stored in the gate region of the MOS transistor to discharge. For example, the circuit arrangement for forming an one bit memory requires, in the simplest form, one transistor and one capacitor. Therefore, the area required of a chip can be considerably saved, and thus, a MOS IC has the advantage over a bipolar IC in that the former is capable of providing a much higher packing density. The operation velocity of a MOS IC, however, not only is inferior to a bipolar IC as stated above, but also it considerably depends on the layout of, for example, the transistors which are incorporated. Thus, the MOS IC has a large dependency on layout.

Taking up, for example, power dissipation and price, a MOS IC is indeed superior to a bipolar IC, but a bipolar IC is easier to handle as compared with a MOS IC with respect to a circuit connection with a bipolar IC, or with respect to matching to a power supply.

As stated above, a MOS IC and a bipolar IC have a difference in their functions and abilities, and thus there has been a demand for the development of such an IC that can effectively make use of these respective strong points of these two types of ICs.

SUMMARY OF THE INVENTION

It is, therefore, an object of the present invention to provide a digital IC which is such that the layout-dependency of those constituent transistors which are superior in their operation velocity is low, and yet that exhibits a high operation velocity and a high packing density.

Another object of the present invention is to provide a digital IC of the type as described above, which smoothly performs the shifting of digital signals successively from one block to another in the IC circuit, by constructing said IC in such manner that a dynamic MOS circuit block using a MOS transistor as its principal constituent device and a static bipolar circuit block having a bipolar transistor as the principal constituent device are both arranged in a common semiconductor substrate, and by setting the operation timing of the respective circuit blocks.

DETAILED DESCRIPTION OF THE PREFERRED EMBODIMENT

Figure 1:
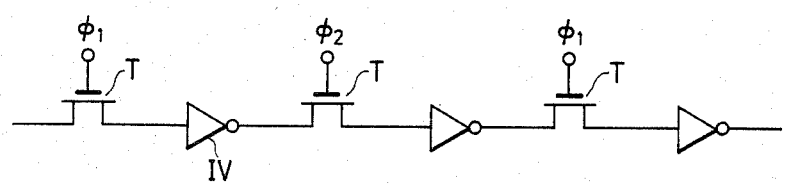
FIG. 1 is a circuit block diagram of a dynamic MOS shift register which can be employed in the present invention.

As stated above, the present invention intends to arrange, in a common semiconductor substrate, a dynamic MOS circuit block and a static bipolar circuit block. It should be understood here that the MOS transistor and the bipolar transistor which are employed in these circuit blocks are those transistors of the type which will be described hereunder.

To begin with, a MOS transistor (MOS FET) will be described. The term "MOS", as well known, originally was intended to express a Metal Oxide Semiconductor structure. The oxide which has been employed most commonly in conventional semiconductor integrated circuits is $SiO_2$. In this specification, the term "MOS" should be understood to cover the so-called MIS structure including also such insulators (dielectrics) as $Si_3N_4$, $Ta_2O_5$ and $Al_2O_3$, in addition to said $SiO_2$.

Also, the term "bipolar transistor" has, conventionally, pointed to the ordinary bipolar transistor. In this specification, however, it does not mean this ordinary bipolar transistor alone, but it includes an SIT (Static Induction Transistor) which has been mentioned above and which is operated in "bipolar mode".

Here, an SIT which is operated in bipolar mode is such transistor as will be described below. In the sense that an SIT is such that the amount of flow of electric carriers, i.e. majority carriers, from the source region to the drain region of an SIT is controlled by the voltage applied to its source electrode and gate electrode, the SIT is a voltage-controlled device like an FET. And, the SIT can be formed to have a MOS type structure and also a junction type structure as in the case of an FET. What differs from an FET is found in that the growth of the depletion layer caused by the voltage applied to the gate electrode can be made to extend easily by designing such factors as the channel length, the channel width, and the impurity concentration of the channel region, whereby the depletion layer can spread and pinch off the channel, and that the potential distribution of that depleted region from source to drain, i.e. space charge region, within the channel which is produced by said pinch-off phenomenon can be varied by an applied gate voltage and/or an applied drain voltage through static induction, whereby the amount of flow of carriers from the source region to the drain region is controlled. This SIT exhibits an I-V characteristic which is a triode tube-like unsaturating drain current characteristic, unlike the MOS-FET. It should be understood that there can be easily obtained by design the condition which will bring about the phenomenon that the channel pinches off without an applied reverse voltage (i.e. for example only by the built-in voltage present across the pn junction), by reducing the length of the channel, and by making the channel width narrow, and also by selecting the impurity concentration of the channel region to be low. In such an instance, as mentioned above, the maximum potential value in the potential distribution which is formed in the channel region in the absence of an applied reverse voltage is higher than the potential of the source region. Therefore, the flow of carriers from the source region to the drain region is inhibited. In other words, an SIT of normally-off type can be manufactured. In such an SIT, as in the case of a bipolar transistor wherein the voltage applied across the emitter region and the base region is forward in direction, the voltage which is to be applied across the source region and the gate region of an SIT is applied in the forward direction, i.e. in the "bipolar mode", so that the maximum value of the potential distribution drops, causing a drain current to flow, and the SIT can be rendered conductive. An SIT which is operated in "bipolar mode" refers to such a transistor as described above. In this specification, such device is included in the category of a bipolar transistor.

In case the SIT of the type described above is incorporated in an integrated circuit, there can be formed a lateral SIT which is such that the direction of the flow of carriers from the source region to the drain region is parallel with the principal surface of the semiconductor substrate. However, there also can be formed a vertical SIT wherein the direction of the flow of the carriers is vertical relative to the principal surface of the semiconductor substrate. This latter type SIT, i.e., vertical SIT, has, furthermore, an important superiority over MOSFET as follows. That is, the operation velocity of an IC becomes smaller with an increase in the capacitance of the lead wire for connecting the electrode of a constituent device or for connecting between constituent devices, or with an increase in the load capacitance. However, since an SIT has a greater transconductance $g_m$ as compared with a MOS-FET, the SIT is capable of controlling a large drain current with a small input voltage, and the size of the SIT device as the electrode can be reduced. Concurrently therewith, the time length required for charging and discharging the load capacitance can be shortened. Thus, in case an SIT is integrated in an IC, instead of a MOS transistor, the packing density thereof is improved, as well as the operation velocity is increased, and the dependency of the constituent devices upon layout is minimized. There have been already developed ICs using this SIT, which is a new type of transistor, as a principal constituent of a digital IC. For example, with respect to an SIT memory, reference should be made to IEEE Journal of Solid State Circuits, SC-13, No. 5, p. 622, 1978. With respect to SSITL (Schottky Static Induction Transistor Logic), reference is to be made to IEEE Journal of Solid State Circuits, SC-14, No. 5, page 873, 1979.

The present invention will hereunder be described in further detail with respect to a preferred embodiment thereof by referring to the accompanying drawings.

Figure 2:
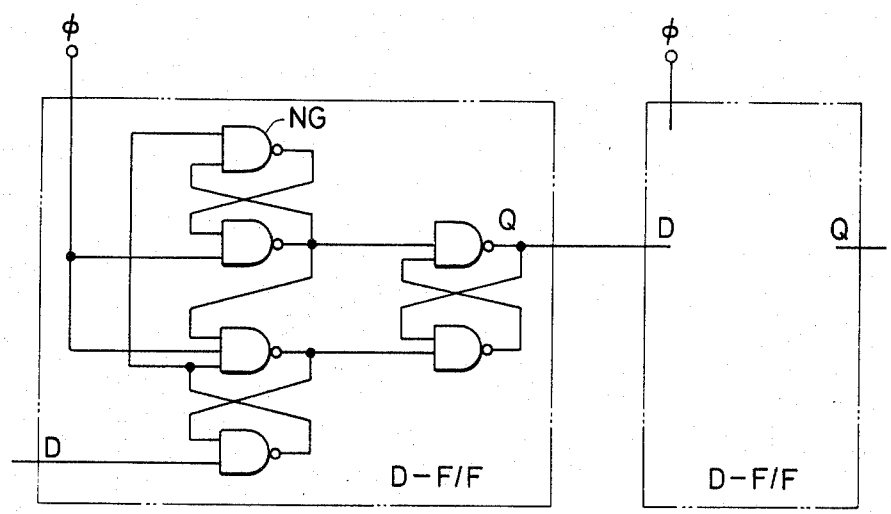
FIG. 2 is a circuit block diagram of a static bipolar shift register which can be employed in the present invention.

FIG. 1 is a schematic representation of an example of a dynamic MOS circuit block which is employed in the present embodiment, and in this case it is a circuit block of a dynamic MOS shift register wherein clock pulses used are of two phases. FIG. 2 schematically shows the circuit block of a static bipolar shift register where the clock pulse used is of a single phase, to show an example of the static bipolar circuit block which is employed in the present embodiment.

The dynamic shift register shown in FIG. 1 is of the arrangement comprising a cascade connection of a plurality of shifting stages each comprising a MOS transistor T and a MOS inverter IV. The transistors in the respective adjacent shifting stages are arranged so that these next-door transistors are controlled by mutually inverted-phase clock signals $\phi_1$ and $\phi_2$, respectively, for the respective shifting stages. Such a shift register is easy to construct, and can be realized with a small number of transistors. In the dynamic MOS shift register of FIG. 1, it will be noted that an inverter IV which is constructed with a MOS transistor is cascade-connected to the next adjacent inverter IV via the presence of a MOS transistor T. The operation or action of the bit storage stage ("bit" points to a binary digital electric signal such as "0" state and "1" state) is carried out by making use of the transistor operation of the MOS transistor and the stray capacitance possessed by the gate electrode of this MOS transistor. The dynamic operations of these circuits are controlled by clock pulses $\phi_1$ and $\phi_2$ which are inverse in phase relative to each other, i.e. the phase of the pulse $\phi_1$ is different by 180° C. from that of the pulse $\phi_2$, and the respective constituent circuits provide for a series of sequential stages. By making use of the presence of the stray capacitance and the relatively long discharging time of the stray capacitance, this cascade of the stages will cause an input signal to be successively shifted from one stage to another. That is, a shift register can be materialized with a small number of transistors and by a simple circuit arrangement. Accordingly, there is achieved a high packing density in the integrated circuit produced. However, its operating frequency, in the case of an ordinary n-channel MOS FET, will be about 10 MHz at most.

On the other hand, the static bipolar shift register shown in FIG. 2 is comprised of delay flip-flops (D-F/F) which are constructed with NAND gates NG using bipolar transistors and are operatively combined in the manner shown. Each flip-flop stage is controlled as to its timing by a single phase clock pulse $\phi$. An input signal is edge-triggered by a clock pulse which assumes this timing, and it is transmitted from one stage over to another in succession. Such type of shift register, as compared with a MOS type shift register, will require a larger area in the surface of a semiconductor chip. However, its operating frequency (operation velocity) is greater than that of a dynamic MOS shift register. For example, in case of SSITL (Schottky Static Induction Transistor Logic), STL (Schottky Transistor Logic), ISL (Integrated Schottky Logic), and STTL (Schottky Transistor-Transistor Logic), the operating frequency will be as great as several tens of MHz to 100 MHz.

In order to achieve the object of the present invention by coupling the above-mentioned dynamic MOS circuit block and static bipolar circuit block in a same single semiconductor substrate, the procedures therefor will be as follows.

Figure 3:
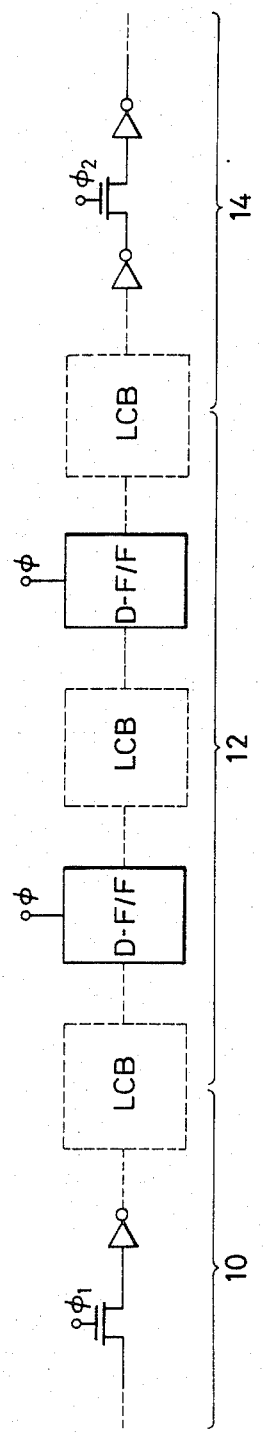
FIG. 3 is an embodiment of a circuit block arrangement of a digital IC according to the invention, which is comprised of a dynamic MOS shift resister and a static bipolar shift register.

FIG. 3 shows an example of circuit block of a digital IC, i.e. a logic circuit of a shift register, which is an embodiment of the present invention. This circuitry is of the arrangement that a dynamic MOS circuit block 10 having the identical arrangement with FIG. 1, an adjacently disposed static bipolar circuit block 12 having the same arrangement as shown in FIG. 2, and an adjacently disposed dynamic MOS circuit block 14 having the same arrangement as that of FIG. 1, are cascade-coupled in this order.

The present invention not only employs such circuit arrangements as mentioned above, but also sets the timing of the delivery of clock pulses in a manner as will be stated below in order to accomplish a smooth shifting of an input binary digital signal "0" or "1" from the respective circuit blocks, i.e. the respective stages, over to the respective next adjacent circuit blocks (stages). The timing chart of the clock pulses to be imparted to the respective circuit blocks is shown in FIG. 4.

More specifically, a bit is shifted from a first stage, i.e. dynamic circuit block 10, over to a second stage, i.e. the adjacently disposed static circuit block 12, at a timing $t_1$ corresponding to a clock pulse $\phi_1$. In the static circuit block 12, the D-F/F of the first stage is edge-triggered (i.e. positive-going trigger) at a timing $t_2$ corresponding to a clock pulse $\phi$ having a same phase as that of the clock signal $\phi_1$.

Figure 4:
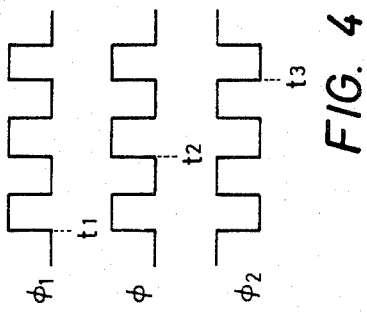
FIG. 4 is a timing chart of clock pulses for the explanation of the operation of the circuit of FIG. 3.

And, from the D-F/F in the final stage of the static circuit block 12, a bit which is has a timing synchronous with the build-up of the clock pulse $\phi$ is shifted to the next-door dynamic circuit block 14, wherein there is received a digital signal in accordance with such clock pulse $\phi_2$ as shown in FIG. 4 having a phase opposite to that of the clock pulse $\phi$. The difference of phase shift between the pulses $\phi_2$ and $\phi$ is 180°. The respective circuit blocks are operated at such timing as mentioned above.

Let us here assume, for the convenience of explanation, that a digital signal is shifted from the static circuit block 12 to the dynamic circuit block 14 at such timing $t_2$ of the respective clock pulses as shown in FIG. 4. It is only necessary in the dynamic circuit block 14 to complete the receipt of a bit by the time of the decay timing $t_3$ of the clock pulse $\phi_2$. Accordingly, there can be achieved a sufficiently large time allowance for the interface between the circuit blocks 10 and 12, and between the circuit blocks 12 and 14, respectively. That is, more preferably, when the duty factors of the respective clock pulses $\phi_1$ and $\phi_2$ are set close to 50% without an overlapping of the pulse durations of the two clock pulses $\phi_1$ and $\phi_2$, it will be understood that the above-said time allowance will be $1/f_{100}$ wherein $f_\phi$ is the frequency of each of the clock pulses, i.e. it will become equal to one cycle. Thus, the signal shift between the respective circuit blocks 10 and 12 and 14 will be carried out very smoothly.

Here, the group of those circuit blocks for setting the timing of operatiion is shown in FIG. 3. It is, however, a matter of course that the individual circuit blocks 10, 12 and 14 may include, as required, any arbitrary logic circuit block in a manner as indicated by LCB in FIG. 3.

It should be understood that, in case the circuitry of FIG. 3 is integrated, and when the polarity of the power supply employed is considered, it is desirable to use transistors having a same polarity. For example, it is desirable to use an n-channel MOS type transistor and an n-channel SIT or an npn transistor to form an integrated circuit in a common substrate.

Figure 5:
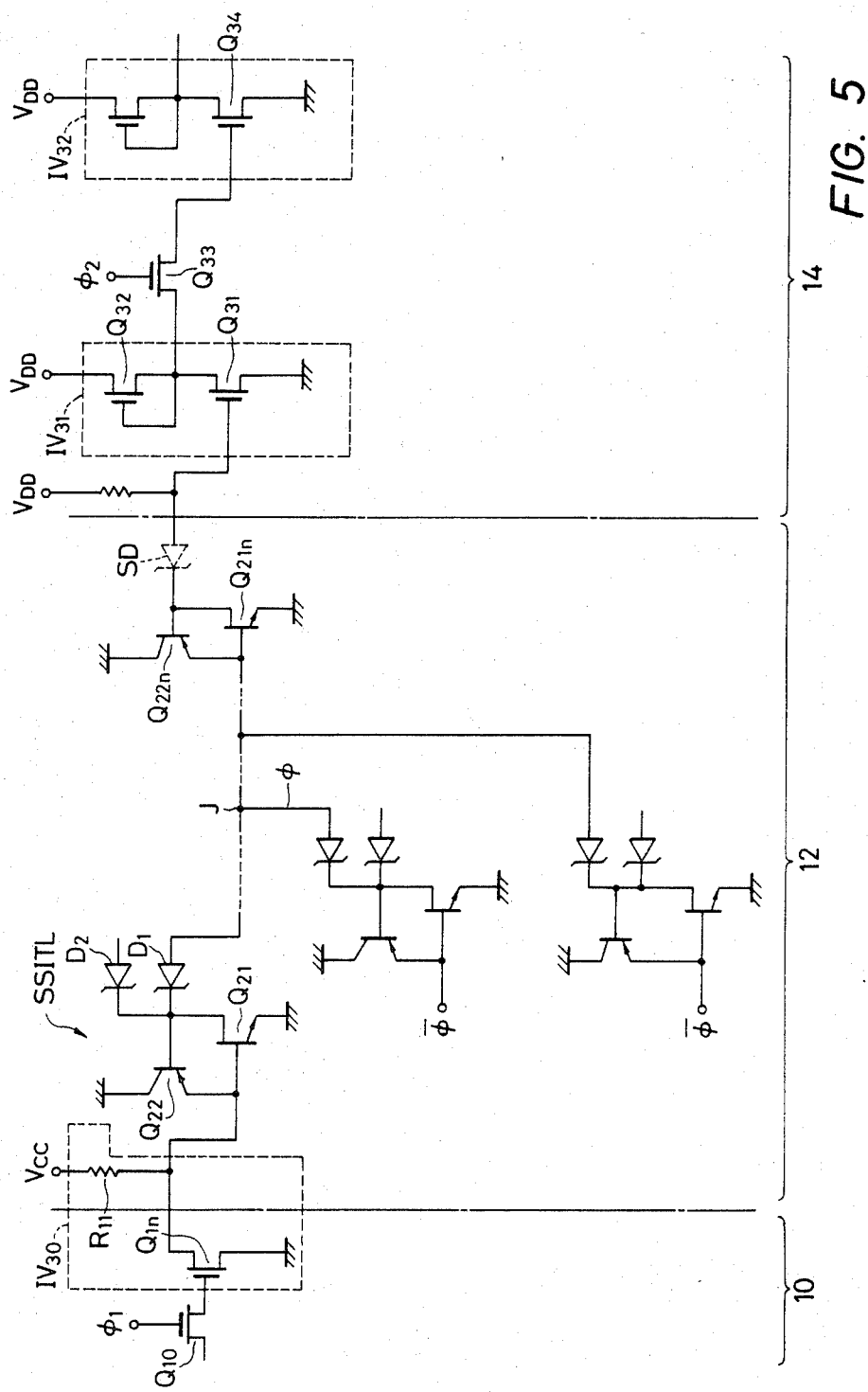
FIG. 5 is a circuit arrangement of the circuit blocks of FIG. 3.

FIG. 5 shows an example of a detailed arrangement of the circuit constituent elements of FIG. 3. It will be noted that in the final stage to shift a bit signal of the dynamic MOS type circuit block 10, there are provided a MOS transistor $Q_{10}$ which is controlled by a clock signal $\phi_1$ and an inverter $IV_{30}$ which is intended to invert the signal delivered from said transistor $Q_{10}$. This inverter $IV_{30}$ is comprised of a MOS transistor $Q_{1n}$ having its source grounded, and a load resistor $R_{11}$ which is connected between the drain of said transistor $Q_{1n}$ and a power supply $V_{cc}$. The load resistor $R_{11}$ and power supply $V_{cc}$ are also adapted to serve as a current supply for an SSITL which is positioned in the initial stage of a static bipolar circuit block 12. The resistor $R_{11}$ may be substituted for by a transistor.

The SSITL which is located in the initial stage of the static circuit block 12 includes said power supply $V_{cc}$, an n-channel SIT $Q_{21}$ whose gate electrode is connected to this power supply, a pnp bipolar transistor $Q_{22}$ which is inserted between the gate electrode and the drain electrode of said transistor $Q_{21}$ to serve as a clamping diode, and decoupling Schottky barrier diodes $D_1$ and $D_2$ which are connected to the drain of the transistor $Q_{21}$. In this embodiment, the transistor $Q_{21}$ is a normally-off SIT whose channel is pinched off by a built-in voltage across the gate and the channel thereof when the applied voltage is substantially zero, i.e. it is an SIT which is operated in "bipolar mode", as stated in the earlier part of this specification. As for the structures of these circuit-constituent elements for packing them, the transistor $Q_{21}$ desirably is formed so that its source region is located in the principal surface of a semiconductor substrate, whereas the transistor $Q_{22}$ desirably is formed in a lateral bipolar fashion to achieve the arrangement that its emitter region is merged with the gate region of the transistor $Q_{21}$. Also, the drain region of the transistor $Q_{21}$ uses an $n^+$ type buried layer. On top of this buried layer is formed a highly resistive n type epitaxial growth layer which concurrently can serve as the channel region of this transistor. Aluminum metal electrodes are formed to be in parallel contact, in rectifying fashion, with said epitaxial growth layer to thereby form the Schottky diodes $D_1$ and $D_2$.

In the static circuit block 12, there are provided a number of inverters serving as logic circuits where each one is comprised of such SSITL as described above. These inverters are combined in an appropriate manner with a wired AND logic circuit as exemplarily indicated in FIG. 5 with respect to a connecting point J to thereby form a number of NAND gates. These NAND gates, in turn, constitute a row of such D-F/Fs, i.e. static shaft registers, as shown in FIG. 2.

A bit signal is transmitted from the dynamic circuit block 10 to the static circuit block 12 of the present invention in such manner as will be described below. Let us now assume that the MOS transistor $Q_{10}$ is turned "on" in accordance with a clock pulse $\phi_1$ and supplies a signal "1" to the transistor $Q_{1n}$. This latter transistor $Q_{1n}$ is rendered to its conducting state by this signal "1", and in response to this state of the transistor $Q_{1n}$, the transistor $Q_{21}$ is rendered to its "off" state. As a result, a signal "1" is delivered from the drain of this transistor $Q_{21}$ via the diodes $D_1$ and $D_2$. The delay flip-flop which is in the initial stage of the static circuit block 12 is controlled in its operation timing by a clock pulse $\phi$ having a same phase as the clock pulse $\phi_1$ as stated above, so that it is edge-triggered synchronously with the build-up of the clock pulse $\phi$ after the transistor $Q_{21}$ is turned "off". More particularly, said delay flip-flop is triggered by a positive-going trigger. As a result, the output Q of the initial D-F/F stage will become "1". And, this output Q="1" is transmitted or shifted in succession to the subsequent D-F/F stage in accordance with the clock pulse $\phi$.

In should be noted here that, in case of the static circuit block 12 of this embodiment, arrangement is provided so that, as a clock pulse, a pulse $\phi$ is provided first, and then thiis pulse $\overline{\phi}$ is inverted once to become a clock pulse $\phi$ by the inverter. This arrangement may be substituted by another system wherein a clock pulse $\phi$ is provided directly. It should be understood also that a Schottky barrier diode SD as a clamping diode may be connected to the drain electrode of the SIT $Q_{22n}$ of the final stage.

An output signal from the static circuit block 12 is delivered to an initial inverter $IV_{31}$ of the dynamic MOS circuit block 14. This inverter $IV_{31}$ is comprised of a MOS transistor $Q_{31}$ which receives, at its gate, an output signal from the drain of a transistor $Q_{21n}$, and a MOS load transistor $Q_{32}$ which is inserted between the drain of this transistor $Q_{31}$ and a voltage supply $V_{DD}$. The output signal of said inverter $IV_{31}$ is adapted to be supplied to an inverter $IV_{32}$ via a MOS transistor $Q_{33}$ which is operably controlled by a clock pulse $\phi_2$.

A bit signal is transmitted from the static circuit block 12 to the dynamic circuit block 14 in a manner as will be described below. Let us here assume that the transistor $Q_{21n}$ is rendered non-conductive by a signal of "0" state in accordance with a clock pulse $\phi$, rendering the output of the circuit block 12 to become "1". Whereupon, the transistor $Q_{31}$ of the inverter $IV_{31}$ is rendered "on", and accordingly the output of the inverter $IV_{31}$ becomes "0". This output "0" will, when the transistor $Q_{33}$ is rendered conductive in accordance with the clock pulse $\phi_2$, be supplied to a transistor $Q_{34}$ of the inverter $IV_{32}$ via the transistor $Q_{33}$, rendering this transistor $Q_{34}$ non-conductive. As a result, the output of the inverter $IV_{32}$ becomes "1". Next, when the transistor $Q_{33}$ becomes non-conductive by a clock pulse $\phi_2$, the output "0" from the inverter $IV_{31}$ is charged up in the stray capacitance of the gate electrode of the transistor $Q_{34}$. Accordingly, the output of the inverter $IV_{32}$ remains "1". The output "1" at such time is transmitted to a subsequent stage.

As stated above, the present invention adroitly utilizes a combination of a dynamic MOS type circuit block and a static bipolar type circuit block. Thus, it is capable of making good use of the features of the MOS type to materialize a high packing density, and of concurrently making use of the features of the bipolar type, especially by making use of a bipolar-mode SIT, to thereby achieve high-speed operation by a relatively free layout of devices. More particularly, these circuit blocks are arranged in a common semiconductor chip, and the timing of the clock pulses is controlled, in accordance with the present invention.

Description has been made above with respect to the present embodiment wherein the constituent logic circuit block is comprised of an inverter which is operated at a timing by a clock pulse or pulses. It should be understood, however, that the logic circuit is not limited thereto, and that so long as a circuit is one which is clocked by a timing pulse or pulses, the conception of the present invention to set timing can be applied to any circuits. Thus, there can be materialized an integration of a digital circuit which is of more complicated functions and yet is operated at a higher speed as compared with conventional semiconductor integrated circuits. The designing and manufacture of such integrated circuit of the presen invention as mentioned above can enjoy a much larger freedom of designing as compared with conventional circuits. Thus, the semiconductor integrated circuit according to the present invention provides a great industrial advantage.

What is claimed is:

1. A digital semiconductor integrated circuit device, for receiving input and outputting output electrical signals, having a common semiconductor substrate and comprising:

at least one dynamic MOS shift register circuit block means for processing digital signals and having a signal input terminal for receiving said input electrical signals, a signal output terminal and a first clock input terminal and being formed in said common substrate;

at least one static induction transistor circuit block means for processing signals and having a signal input terminal, a signal output terminal for outputting said output electrical signals and a second clock input terminal and being formed in said common substrate, said static induction transistor circuit block means comprising a normally-off static induction transistor being operated in a bipolar mode;

said signal output terminal of said at least one dynamic MOS shift register circuit block means being connected to said signal input terminal of said at least one static induction transistor circuit block means; and first and second clock signal generating means for, respectively, generating first and second clock signals respectively applied to said first and second clock input terminals, said first and second clock signals having a predetermined timing relationship with each other so that said dynamic MOS shift register circuit block means and said static induction transistor circuit block means are operated in relation with each other according to said predetermined timing relationship.

2. A digital semiconductor integrated circuit device, for receiving input and outputting output electrical signals, having a common semiconductor substrate and comprising:

a dynamic MOS shift register circuit block formed on said common substrate, comprising at least two dynamic shift registers, and having a signal input terminal for receiving said input electrical signals, a signal output terminal and a clock input terminal;

a static bipolar transistor circuit block formed on said common substrate, comprising a static bipolar transistor shift register, and having a signal input terminal, a signal output terminal for outputting said output electrical signals and a clock input terminal; and clock generating means for generating first and second clock signals having inverted phases relative to each other, said first clock signal being applied to the input clock terminal of one of said at least two dynamic shift registers and to the clock input terminal of said static bipolar transistor shift register and said second clock signal being applied to the clock input terminal of the other one of said at least two dynamic shift registers;

said dynamic MOS circuit block being coupled to said static bipolar transistor block for transmitting a digital signal to said static bipolar transistor circuit block in response to said first clock signal, and said static bipolar transistor circuit block, upon receipt of said digital signal, shifting said digital signal in response to a second clock pulse of said first clock signal.

3. A digital semiconductor integrated circuit device according to claim 2, in which:

said one of said at least two dynamic MOS shift registers, the static bipolar transistor shift register and said other one of said at least two dynamic MOS shift registers are cascaded respectively in the named order, each of said at least two dynamic MOS shift registers comprises cascade connected signal-transmitting stages each of said stages comprising a MOS transistor and a MOS inverter, and arranged so that one of the adjacently disposed MOS transistors is operably controlled by one of the mutually phase-inverted clock pulses from said first and second clock signals and the other one of the adjacently disposed MOS transistors is operably controlled by the other one of the mutually phase-inverted clock pulses from said first and second clock signals, and said static bipolar shift register comprises a combination of delay flip-flops formed with a combination of NAND gates employing transistors which operate in a bipolar transistor mode and which are operably controlled by said first clock signal, to thereby be edge-triggered.

4. A digital semiconductor integrated circuit device according to claim 3, in which:

each one of said NAND gate transistors are any one of an ordinary bipolar transistor and a transistor comprised of a normally-off type static induction transistor which is operated in a bipolar mode.

5. A digital semiconductor integrated circuit device, for receiving input and outputting output electrical signals, having a common semiconductor substrate and comprising:

a dynamic MOS shift register circuit block formed on said common substrate, comprising at least two dynamic shift registers, and having a signal input terminal, a signal output terminal and a clock input terminal;

a static bipolar transistor circuit block formed on said common substrate, comprising a static bipolar transistor shift register, and having a signal input terminal for receiving input electrical signals, a signal output terminal and a clock input terminal; and clock generating means for generating first and second clock signals having inverted phases relative to each other, said first clock signal being applied to the clock input terminal of one of said at least two dynamic shift registers and to the clock input terminal of said bipolar transistor shift register and said second clock signal being applied to the clock input terminal of the other one of said at least two dynamic shift registers;

said static bipolar transistor circuit block being coupled to said dynamic MOS shift register circuit block for transmitting a digital signal to said dynamic MOS shift register circuit block in response to said first clock signal, and said dynamic MOS shift register circuit block output shifting said digital signal in response to said second clock signal.

6. A digital semiconductor integrated circuit device according to claim 5, in which:

said one of said at least two dynamic MOS shift registers, the static bipolar transistor shift register and said other one of said at least two dynamic MOS shift registers are cascaded respectively in the named order, each of said at least two dynamic MOS shift registers comprises cascade connected signal-transmitting stages each of said stages comprising a MOS transistor and a MOS inverter, and arranged so that one of the adjacently disposed MOS transistors is operably controlled by one of the mutually phase-inverted clock pulses from said first and second clock signals and the other one of the adjacently disposed MOS transistors is operably controlled by the other one of the mutually phase-inverted clock pulses from said first and second clock signals, and said static bipolar shift register comprises a combination of delay flip-flops formed with a combination of NAND gates employing transistors which operate in a bipolar transistor mode and which are operably controlled by said first clock signal, to thereby be edge-triggered.

7. A digital semiconductor integrated circuit device according to claim 6, in which:

each one of said NAND gate transistors are any one of an ordinary bipolar transistor and a transistor comprised of a normally-off type static induction transistor which is operated in a bipolar mode.

8. A digital semiconductor integrated circuit, for receiving input and outputting output electrical signals, having a common semiconductor substrate and comprising:

a first circuit block, having signal input and output terminals and a clock input terminal, said signal input terminal receiving said input electrical signals, comprised of a dynamic MOS shift register for being rendered inoperative for input signals having a frequency of zero Hertz; and a second circuit block, having signal input and output terminals and a clock input terminal, comprised of a static bipolar transistor shift register for being rendered operative also for input signals of zero Hertz; and clock generating means for outputting first and second clock signals having a certain timing relationship to each other and being respectively applied to said clock input terminals of said first and second circuit blocks;

said first circuit block having an output coupled to an input of said second circuit block to deliver out a train of digital signals in accordance with said certain timing relationship;

said second circuit block receiving said digital signals and outputting shifted digital signals, representing said output electrical signals, one after another each at a timing one bit later than said certain timing.

9. A digital semiconductor integrated circuit according to claim 8, in which:

said static shift register is comprised of bipolar transistors.

10. A digital semiconductor integrated circuit according to claim 9, further comprising:

a logic circuit inserted between said first circuit block and said second circuit block for performing a logic operation;

said logic circuit having its input connected to the output of said first circuit block and its output connected to the input of said second circuit block.

11. A digital semiconductor integrated circuit, for receiving input and outputting output electrical signals, having a common semiconductor substrate and comprising:

a first circuit block, having signal input and output terminals and a clock input terminal, said signal input terminal receiving said input electrical signals, comprised of a static bipolar transistor shift register being rendered operative for input signals having a frequency of zero Hertz; and a second circuit block, having signals input and output terminals and a clock input terminal, comprised of a dynamic MOS shift register being rendered inoperative for signals having a frequency of zero Hertz; and clock generating means for outputting first and second clock signals having a certain timing relationship to each other and being respectively applied to said clock input terminals of said first and second circuit blocks;

said first circuit block having an output coupled to an input of said second circuit block to deliver out a train of digital signals in accordance with said certain timing relationship;

said second circuit block receiving said digital signals and outputting shifted digital signals, representing said output electrical signals, one after another each at a timing one bit later than said certain timing.

12. A digital semiconductor integrated circuit according to claim 11, in which:

said static shift register is comprised of bipolar transistors.

13. A digital semiconductor integrated circuit according to claim 12, further comprising:

a logic circuit inserted between said first circuit block and said second circuit block for performing a logic operation;

said logic circuit having its input connected to the output of said first circuit block and its output connected to the input of said second circuit block.

14. A clocked digital logic integrated circuit for receiving input digital signals and outputting processed digital signals in accordance with a clock timing, comprising:

a first circuit block means and a second circuit block means both provided on a common semiconductor substrate for processing said input digital signals;

one of said first and second circuit block means being comprised of a dynamic MOS circuit rendered inoperative for signals having a frequency of zero Hertz;

the other one of said first and second circuit block means being comprised of a static bipolar transistor circuit rendered operative for signals of zero Hertz; and clock generating means for outputting first and second clock signals having a certain timing relationship to each other and being respectively applied to said clock input terminals of said first and second circuit blocks;

said first circuit block means receiving said input digital signals and having an output connected to an input of said second circuit block means to deliver out a train of digital signals in accordance with said certain timing relationship;

said second circuit block means receiving said train of digital signals and outputting said processed digital signals one after another each at a clock timing one bit later than said certain timing.

15. A digital semiconductor integrated circuit device, for receiving input and outputting output electrical signals, having a common semiconductor substrate and comprising:
- at least one dynamic MOS phase modification processing circuit block means for processing digital signals and having a signal input terminal for receiving said input electrical signals, a signal output terminal and a first clock input terminal and being formed in said common substrate;
- at least one static induction transistor circuit block means for processing digital signals and having a signal input terminal, a signal output terminal for outputting said output electrical signals and a second clock input terminal and being formed in said common substrate, said static induction transistor circuit block means comprising a normally-off static induction transistor being operated in a bipolar mode;
- said signal output terminal of said at least one dynamic MOS phase modification processing circuit block means being connected to said signal input terminal of said at least one static induction transistor circuit block means; and
- first and second clock signal generating means for, respectively, generating first and second clock signals respectively applied to said first and second clock input terminals, said first and second clock signals having a predetermined timing relationship with each other so that said dynamic MOS phase modification processing circuit block means and said static induction transistor circuit block means are operated in relation with each other according to said predetermined timing relationship.

16. A digital semiconductor integrated circuit device, for receiving input and outputting output electrical signals, having a common semiconductor substrate and comprising:
- at least one dynamic MOS shift processing circuit block means for processing digital signals and having a signal input terminal for receiving said input electrical signals, a signal output terminal and a first clock input terminal and being formed in said common substrate;
- at least one static induction transistor circuit block means for processing digital signals and having a signal input terminal, a signal output terminal for outputting said output electrical signals and a second clock input terminal and being formed in said common substrate, said static induction transistor circuit block means comprising a normally-off static induction transistor being operated in a bipolar mode;
- said signal output terminal of said at least one dynamic MOS shift processing circuit block means being connected to said signal input terminal of said at least one static induction transistor circuit block means; and
- first and second clock signal generating means for, respectively, generating first and second clock signals respectively applied to said first and second clock input terminals, said first and second clock signals having a predetermined timing relationship with each other so that said dynamic MOS shift processing circuit block means and said static induction transistor circuit block means are operated in relation with each other according to said predetermined timing relationship.

* * * * *

UNITED STATES PATENT AND TRADEMARK OFFICE
CERTIFICATE OF CORRECTION

PATENT NO. : 4,525,639
DATED : June 25, 1985
INVENTOR(S) : NONAKA

It is certified that error appears in the above-identified patent and that said Letters Patent is hereby corrected as shown below:

In the claims,

Claim 1, column 9, line 17, after "means for processing" insert --digital--.

Claim 2, column 9, line 65, after "static bipolar transistor" insert --circuit--.

Claim 11, column 12, line 9, change "signals" to --signal--.

Signed and Sealed this

Twenty-sixth Day of January, 1988

Attest:

DONALD J. QUIGG

Attesting Officer

Commissioner of Patents and Trademarks